United States Patent
Thompson et al.

(10) Patent No.: US 9,966,751 B2
(45) Date of Patent: May 8, 2018

(54) TELECOMMUNICATIONS ENCLOSURE WITH CABLE SEAL

(71) Applicant: CommScope Technologies LLC, Hickory, NC (US)

(72) Inventors: Roy Keller Thompson, Apex, NC (US); Gary W. Adams, Holly Springs, NC (US); Thomas Ross Marmon, Angier, NC (US)

(73) Assignee: CommScope Technologies, LLC, Hickory, NC (US)

( * ) Notice: Subject to any disclaimer, the term of this patent is extended or adjusted under 35 U.S.C. 154(b) by 0 days. days.

(21) Appl. No.: 15/539,605

(22) PCT Filed: Dec. 28, 2015

(86) PCT No.: PCT/US2015/067670
§ 371 (c)(1),
(2) Date: Jun. 23, 2017

(87) PCT Pub. No.: WO2016/109425
PCT Pub. Date: Jul. 7, 2016

(65) Prior Publication Data
US 2018/0041018 A1 Feb. 8, 2018

Related U.S. Application Data

(60) Provisional application No. 62/097,348, filed on Dec. 29, 2014.

(51) Int. Cl.
*H02G 15/013* (2006.01)
*H05K 5/00* (2006.01)
*H05K 5/02* (2006.01)
*H05K 5/06* (2006.01)
*H02G 15/00* (2006.01)

(52) U.S. Cl.
CPC ......... *H02G 15/013* (2013.01); *H02G 15/003* (2013.01); *H05K 5/0004* (2013.01); *H05K 5/0221* (2013.01); *H05K 5/0247* (2013.01); *H05K 5/069* (2013.01)

(58) Field of Classification Search
CPC .......................... H02G 15/003; H02G 15/013
See application file for complete search history.

(56) References Cited

U.S. PATENT DOCUMENTS 5,561,269 A  10/1996 Robertson et al.
5,825,960 A  10/1998 Woodward et al.
(Continued)

FOREIGN PATENT DOCUMENTS

JP  2010-284077 A  12/2010

OTHER PUBLICATIONS

International Search Report and Written Opinion of the International Searching Authority for corresponding International Patent Application No. PCT/US2015/067670 dated Apr. 18, 2016, 7 pages.

*Primary Examiner* — Hung V Ngo
(74) *Attorney, Agent, or Firm* — Merchant & Gould P.C.

(57) ABSTRACT

A telecommunications enclosure is provided with reliable sealing around cables entering therein. The enclosure includes one or more cable ports with cable seals made from a material that includes an oil-bleed silicone rubber. The cable ports may also have a convoluted or serrated inner surface configured to engage and support the cable seals.

2 Claims, 8 Drawing Sheets

(56) References Cited

U.S. PATENT DOCUMENTS

| | | | | |
|---|---|---|---|---|
| 5,844,171 A | * | 12/1998 | Fitzgerald | H02G 15/113 174/138 F |
| 6,246,003 B1 | * | 6/2001 | Ferris | H01R 4/70 174/84 R |
| 6,265,665 B1 | * | 7/2001 | Zahnen | H01R 4/70 174/70 A |
| 6,280,235 B1 | * | 8/2001 | Radliff | H01R 13/501 439/456 |
| 6,450,829 B1 | * | 9/2002 | Weisz-Margulescu | H01R 13/424 439/263 |
| 6,730,847 B1 | * | 5/2004 | Fitzgerald | H01R 4/22 174/74 R |
| 6,881,901 B2 | * | 4/2005 | Egan | H02G 15/013 16/2.1 |
| 6,918,787 B2 | * | 7/2005 | Egan | H01R 13/5213 439/587 |
| 6,948,976 B2 | * | 9/2005 | Goodwin | H01R 13/512 174/92 |
| 6,955,558 B1 | * | 10/2005 | Low | H02G 15/013 439/467 |
| 7,285,725 B1 | | 10/2007 | Saman | |
| 9,012,774 B2 | * | 4/2015 | Simmons | H01R 9/223 174/50.5 |
| 2007/0256848 A1 | | 11/2007 | Allen et al. | |

* cited by examiner

TELECOMMUNICATIONS ENCLOSURE WITH CABLE SEAL

CROSS-REFERENCE TO RELATED APPLICATION

This application is a National Stage Application of PCT/US2015/067670, filed on Dec. 28, 2015, which claims the benefit of U.S. Patent Application Ser. No. 62/097,348, filed on Dec. 29, 2014, the disclosures of which are incorporated herein by reference in their entireties. To the extent appropriate, a claim of priority is made to each of the above disclosed applications.

BACKGROUND

Telecommunications enclosures or cable enclosures are typically used to splice copper cables or fiber optic cables. The enclosures provide interior space for depositing splice organizers and other devices therein in a sealed manner. The enclosures also define cable ports for receiving cables of various types, such as a main cable and drop cables. The enclosures employ various sealing elements to environmentally seal the cable ports when engaging the cables. The sealing performance gradually deteriorates as the enclosures and the sealing elements deform due to constant stress over an extended period of time.

SUMMARY

In general terms, this disclosure is directed to a telecommunications enclosure with cable seals. In one possible configuration and by non-limiting example, the telecommunications enclosure includes one or more cable ports with cable seals made from a material that includes an oil-bleed silicone rubber. The cable ports may also have a convoluted or serrated inner surface configured to engage and support the cable seals. The material used for the cable seals and the geometry of the cable ports reliably seal telecommunications cables entering the telecommunications enclosure.

The above features and advantages and other features and advantages of the present teachings are readily apparent from the following detailed description of the best modes for carrying out the present teachings when taken in connection with the accompanying drawings.

DETAILED DESCRIPTION

Various embodiments will be described in detail with reference to the drawings, wherein like reference numerals represent like parts and assemblies throughout the several views.

Figure 1:
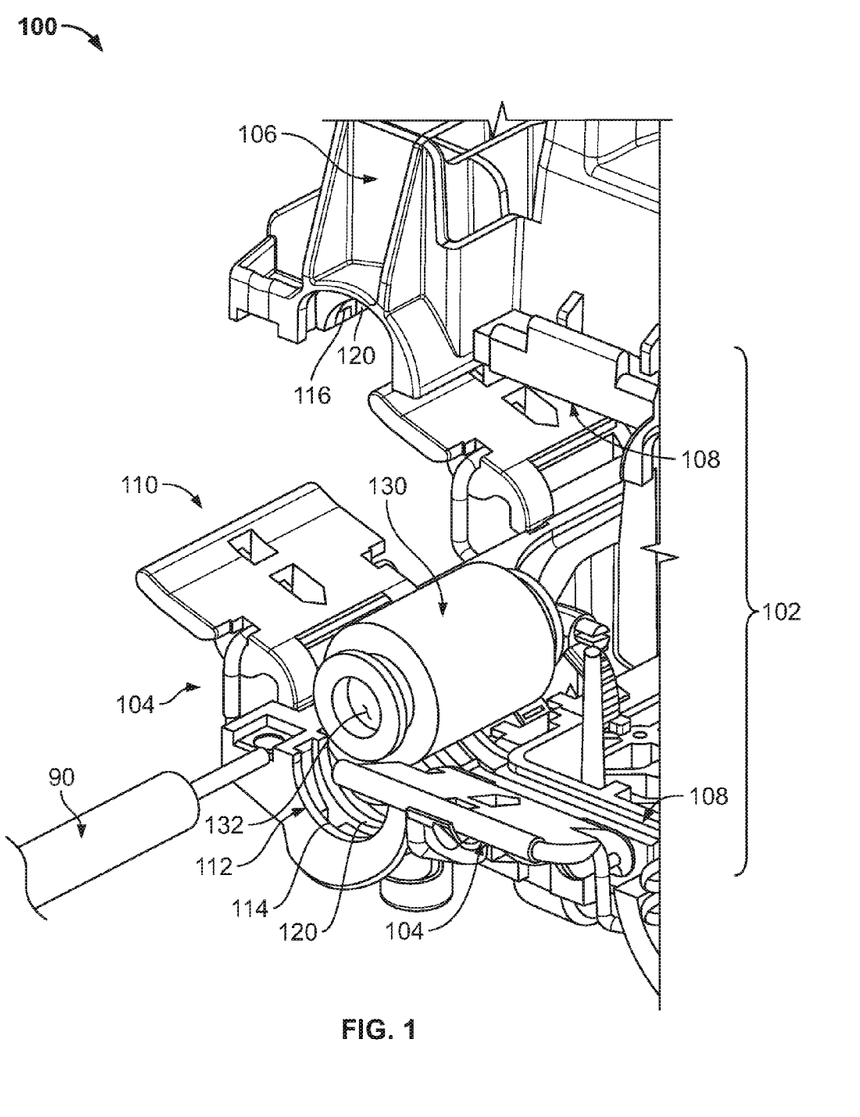
FIG. 1 illustrates an example telecommunications enclosure with a cable seal.

Referring to FIG. 1, a telecommunications enclosure 100 is described. The enclosure 100 includes a housing 102 having a first housing piece 104 (e.g., a lower shell or base) and a second housing piece 106 (e.g., an upper shell or cover), which are coupled each other along a perimeter interface 108 (also see FIGS. 5 and 7). The first housing piece 104 can be attached to the second housing piece 106 with a latch arrangement 110. The latch arrangement 110 can be configured of various types. In some examples, the latch arrangement 110 includes a plurality of fastening elements and a plurality of corresponding hooks. The fastening elements are formed on one of the first and second housing pieces 104 and 106 and configured to hinge, and the hooks are correspondingly formed on the other of the first and second housing pieces 104 and 106, such that the fastening elements are captively engaged in the corresponding hooks. In the illustrated example, the fastening elements are formed on the first housing piece 104 and the hooks are formed on the second housing piece 106 so that the fastening elements are hooked in the hooks.

Figure 2:
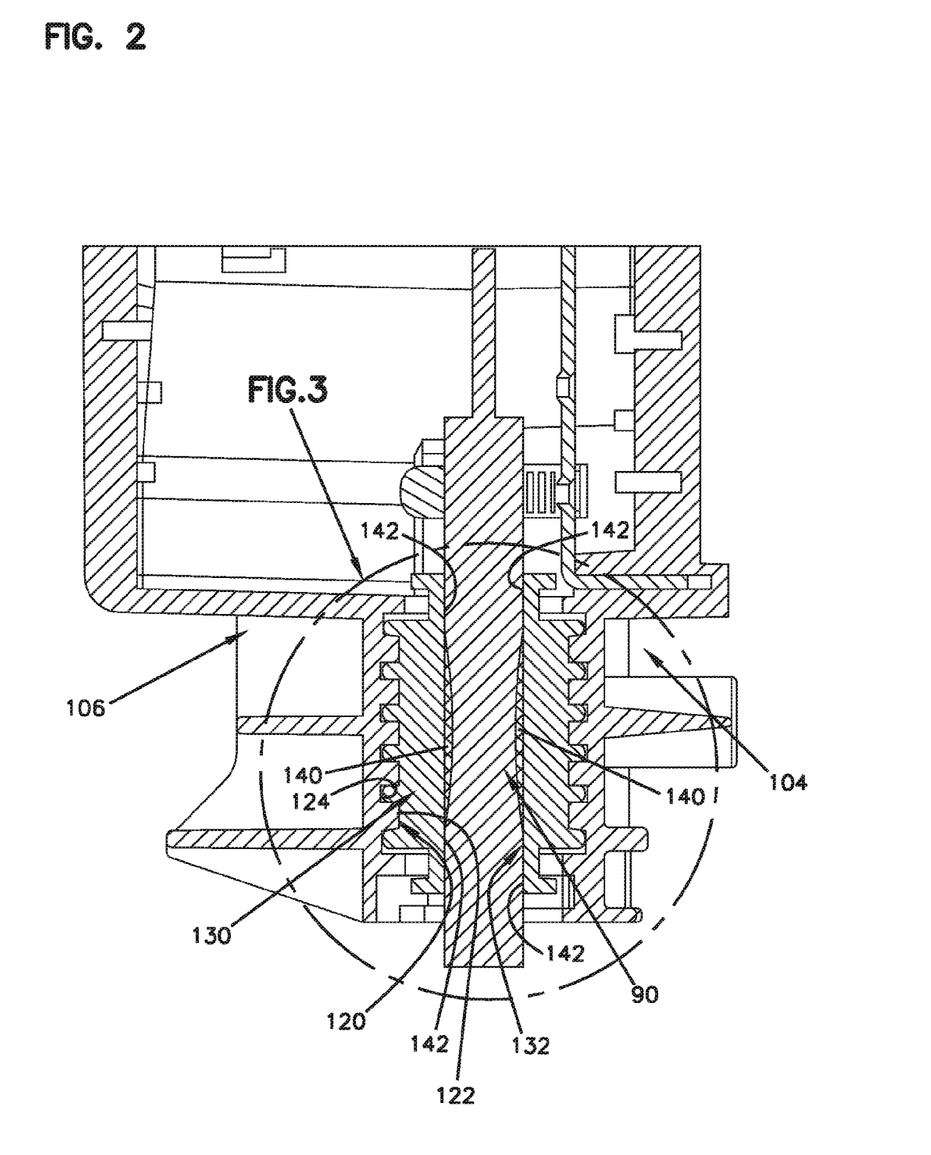
FIG. 2 is a cross-sectional view of the cable seal disposed in the telecommunication enclosure seal shown in FIG. 1.

The housing 102 defines one or more cable ports 112 on one or more sides thereof. The cable ports 112 are configured to sealingly receive and support a portion of a telecommunications cable 90, as shown in FIG. 2. In some examples, the cable ports 112 are defined by the first and second housing pieces 104 and 106 that are coupled each other at the perimeter interface 108. Each of the cable ports 112 has a first half-portion 114 defined by the first housing piece 104 and a second half-portion 116 defined by the second housing piece 106.

Figure 5:
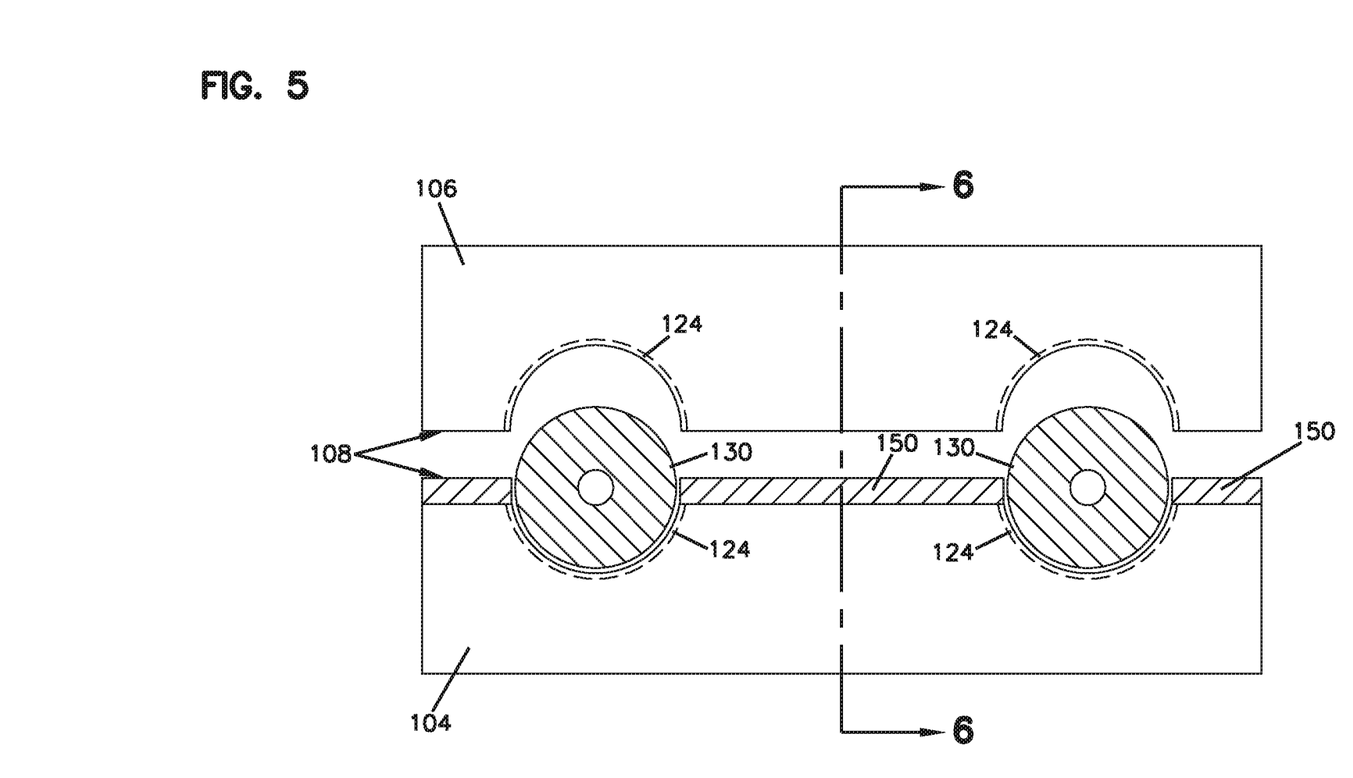
FIG. 5 is a schematic cross-sectional view of a perimeter sealing element and the cable seal before the telecommunications enclosure is closed.
Figure 6:
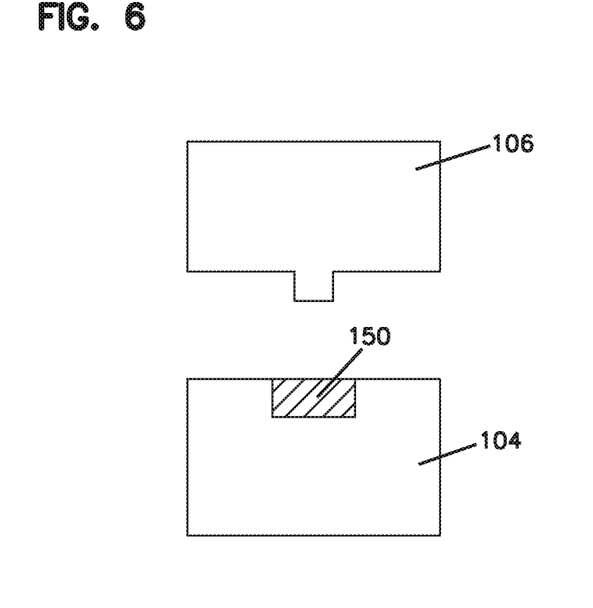
FIG. 6 is a schematic cross-sectional view of the perimeter sealing element disposed in the telecommunications enclosure.
Figure 7:
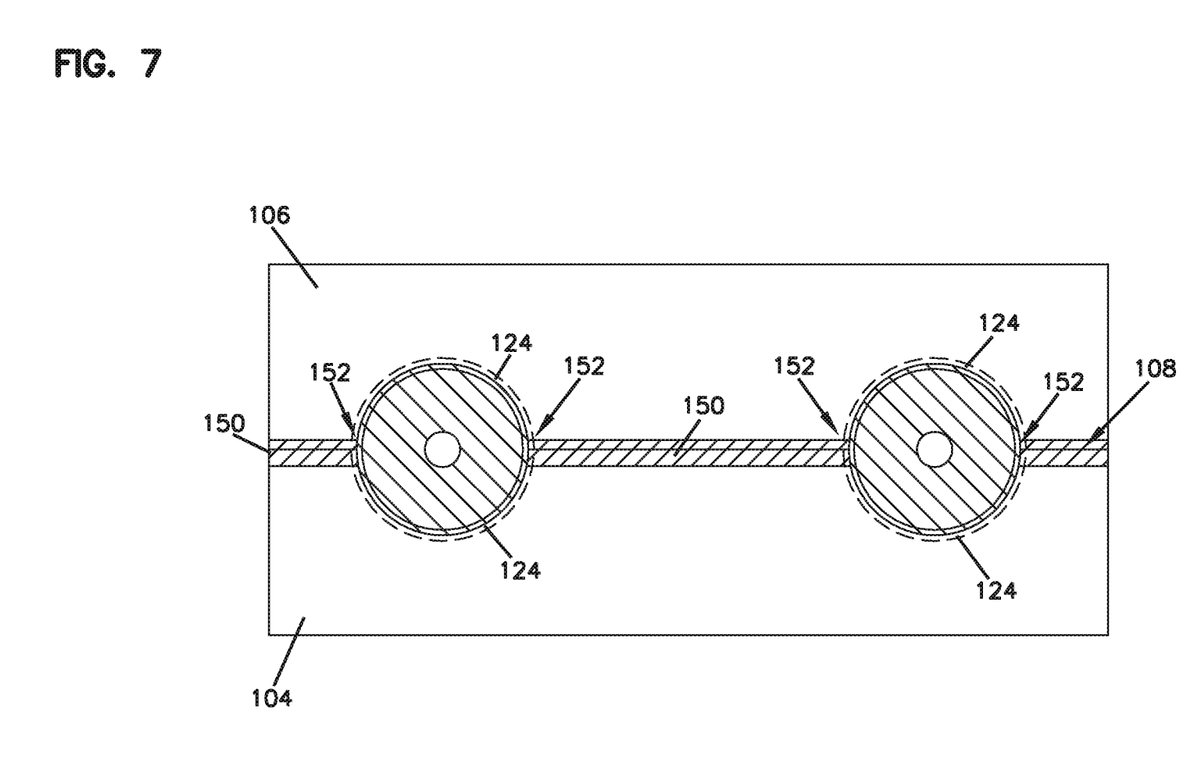
FIG. 7 is a schematic cross-sectional view of the perimeter sealing element and the cable seal disposed in the telecommunications enclosure when the enclosure is closed.

The perimeter interface 106 is sealed with a sealing element 150 (FIGS. 5-7) between the first and second housing pieces 104 and 106. The sealing element 150 is provided at the perimeter interface 106 between the first and second housing pieces 104 and 106. As illustrated in FIGS. 5 and 7, in some examples, the sealing element 150 is not provided for the cable ports 112 while the cable ports 112 are sealed with cable seals 130, as described below. The sealing element 150 is arranged at the perimeter interface 106 and meets the cable seals 130 at a location 152 (e.g., a triple point) where the perimeter interface 106 and the inner surface of each cable port 112 abut (FIG. 7). As described herein, the grooves 124 prevent the cable seals 130 from extending over the triple point 152 to the perimeter interface 106 and overlapping the sealing element 150 when the first and second housing pieces 104 and 106 are closed with the latch arrangement 110. The sealing element 150 can include a material including a thermoplastic gel. Examples of thermoplastic gels include a gel labeled L2912.

Figure 3:
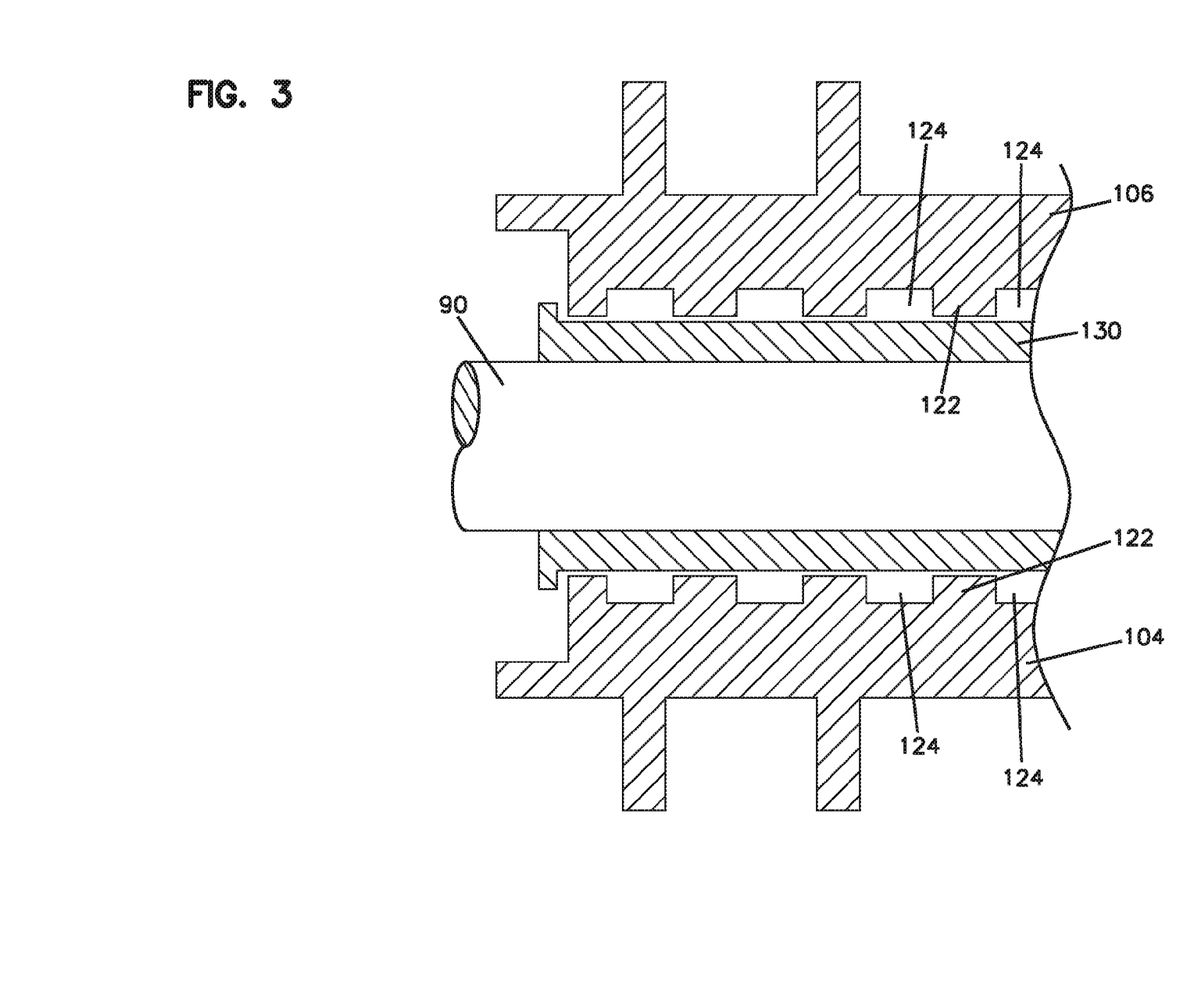
FIG. 3 is an enlarged view of the cable seal of FIG. 2 before the telecommunications enclosure is closed.

Referring to FIGS. 1-4, the cable ports 112 have a serrated or toothed inner surface 120. As illustrated in FIGS. 2 and 3, the inner surface 120 can include a plurality of annular projections 122 separated by a plurality of annular grooves 124. In other embodiments, the inner surface 120 can include a series of square ribs and corresponding valleys, or a wave form of peaks and corresponding valleys.

The enclosure 100 further includes a cable seal 130 to seal the cable 90 at the cable ports 112. The cable seal 130 is configured to fit in the cable port 112. The cable seal 130 defines a cable passage 132 for receiving the cable 90. The cable seal 130 can be made from a material that includes oil-bleeding silicone rubber. In some examples, the cable seal 130 made from oil-bleeding silicone rubber has a hardness ranging between 10 and 50 Shore A. In other examples, the cable seal 130 made from oil-bleeding silicone rubber has a hardness ranging between 20 and 40 Shore A. In some examples, the cable seal 130 made from oil-bleeding silicone contains about 2% oil in silicone. In other examples, the cable seal 130 made from oil-bleeding silicone contains less than 2% oil in silicone. The oil contained in the cable seal 130 is intended to leak out to lubricate an interface between the cable port 122 and cable seal 130. Examples of oil-bleeding silicone rubber are available from Wacker Chemie AG in Germany.

The cable seal 130 has a smooth outer body that is compressed when the cable seal 130 fits in the cable port 112. For example, when the first and second housing pieces 104 and 106 are secured together by the latch arrangement 110, the cable seal 130 is pressed between the first and second half-portions 114 and 116.

Figure 4:
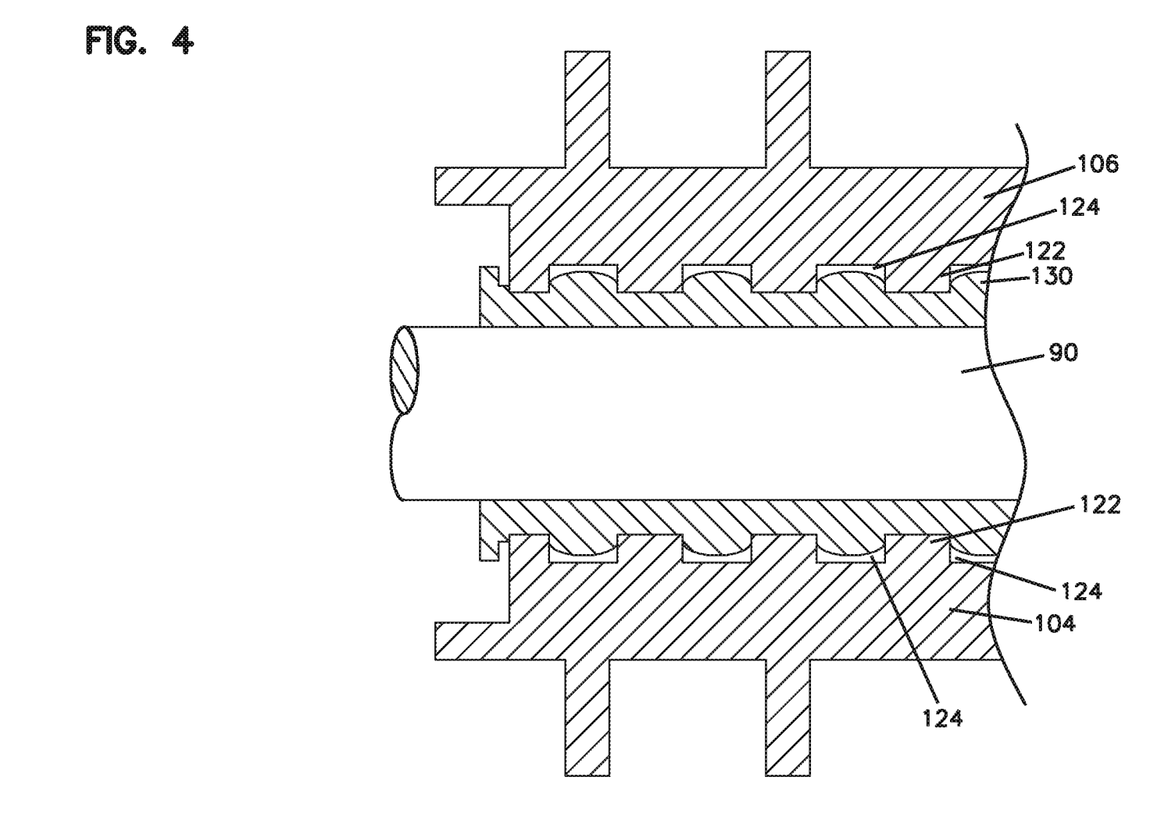
FIG. 4 is an enlarged view of the cable seal of FIG. 2 disposed in the telecommunications enclosure when the enclosure is closed.

As illustrated in FIGS. 3 and 4, the serrated or toothed inner surface 120 of the cable port 112 can be defined by the annular projections 122 and the annular grooves 124, which are alternatingly arranged. When pressed between the first and second half-portions 114 and 116 of the cable port 112, the cable seal 130 is circumferentially compressed by the annular projections 122 to cause outer portions of the cable seal 130 to elastically deform into the annular grooves 124 (FIG. 4). The annular grooves 124 are sized such that the annular grooves 124 are only partially filled by the outer portions of the cable seal 130.

The annular grooves 124 can provide space for the cable seal 130 to properly expand thereto and store elastic energy to be released to maintain a reliable sealing at the cable port 112. For example, the grooves 124 may prevent the cable seal 130 from extending into the perimeter interface 106 between the first and second housing pieces 104 and 106. Without the grooves 124, the compressed cable seal 130 can extend into the perimeter interface 106 and interfere with the sealing element 150 at or around the triple point 152 when the first and second housing pieces 104 and 106 are closed, thereby causing the housing 102 not to close properly with reliable environmental sealing. The cable seal 130 can expand and displace partially into the grooves 124, and thus does not interfere with the closing of the first and second housing pieces 104 and 106.

Further, the annular grooves 124 operate as a controlled reservoir for storing elastic energy. In particular, the compressed cable seal 130 stores elastic energy therewithin to provide prolonged sealing despite a gradual deformation (i.e., creep) of the housing 102 and/or the cable seal 130. The energy stored in the compressed cable seal 130 may compensate stress relaxation resulting from the creep of the housing 102 and/or the cable seal 130 by releasing at least some of the energy stored therein.

The cable passage 132 of the cable seal 130 is configured to fit the cable 90. In some examples, the cable passage 132 is sized and shaped to provide slight interference with the cable 90 being inserted therethrough. In the illustrated examples of FIGS. 1-3, the cable seal 130 is configured to engage one main cable 90. In some examples, as shown in FIG. 2, the cable passage 132 includes a middle section 140 that is configured slightly smaller than the smallest diameter of the cable 90, and tapered ends 142 that allow for receiving a cable 90 with a larger diameter.

The oil contained in the cable seal 130 can provide surface wetting of the outer surfaces of the cable seal 130, thereby allowing the cable seal 130 to conform to the geometry of the cable 90 and/or the enclosure 100 (e.g., the cable ports 112) and provide more reliable sealing. The oil-bleed material used for the cable seal 130 can fill in inconsistent and irregular surfaces of the cable 90 and the enclosure 100 at a microscopic level to prevent impurities or foreign matters (e.g., water) from intruding into the enclosure 100. Further, the oil-bleed material can fill in abrupt transitions that do not lend to the cable seal 130, conforming to the irregular geometry. As such, the oil-bleed silicone rubber used for the cable seal 130 provides improved reliability of sealing.

Figure 8:
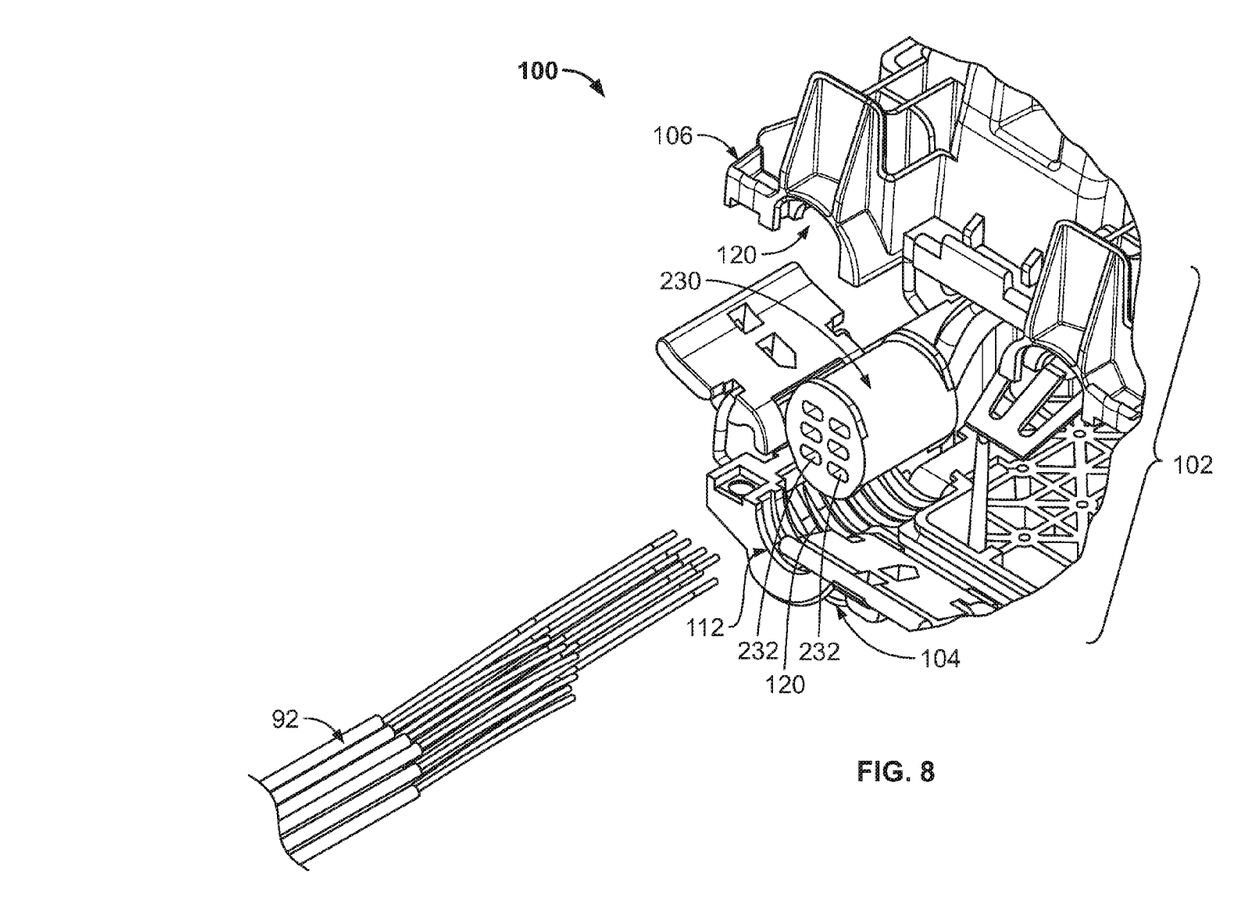
FIG. 8 illustrates another example cable seal used in the telecommunication enclosure.

FIG. 8 schematically illustrates an example cable seal 230 for multiple drop cables 92. The cable seal 230 is similar to the cable seal 130 except for a plurality of holes 232. In particular, the cable seal 230 includes a plurality of holes 232 through a body of the cable seal 230. The holes 232 are configured to engage the drop cables 92, respectively, in a manner similar to the cable passage 132 as illustrated in FIGS. 1-3. The details of the cable seal 230 and associated features of the enclosure 100 are not repeated herein for brevity purposes.

The various examples and teachings described above are provided by way of illustration only and should not be construed to limit the scope of the present disclosure. Those skilled in the art will readily recognize various modifications and changes that may be made without following the example examples and applications illustrated and described herein, and without departing from the true spirit and scope of the present disclosure.

What is claimed is:

1. A telecommunications enclosure comprising:
    a housing including first and second housing pieces that meet at a sealed perimeter interface, the housing defining a cable port having a first half-portion defined by the first housing piece and a second half-portion defined by the second housing piece, the cable port including a plurality of annular projections separated by annular grooves;
    a latch arrangement for securing the first and second housing pieces together; and
    a cable seal that fits in the cable port, the cable seal defining a cable passage for receiving a cable, the cable seal being made from a material that includes oil bleed-out silicone rubber, wherein when the first and second housing pieces are secured together by the latch arrangement the cable seal is pressed between the first and second half-portions such that the annular projections circumferentially compress the cable seal causing outer portions of the cable seal to elastically deform into the annular grooves and store elastic energy therewithin, the annular grooves being sized such that the annular grooves are only partially filled by the outer portions of the cable seal.

2. The telecommunications enclosure of claim 1, wherein the sealed perimeter interface is sealed with a thermoplastic gel.

* * * * *